(12) United States Patent
Suyama et al.

(10) Patent No.: US 11,784,655 B2
(45) Date of Patent: Oct. 10, 2023

(54) ANALOG-TO-DIGITAL CONVERTER, WIRELESS COMMUNICATION APPARATUS, AND ANALOG-TO-DIGITAL CONVERSION METHOD

(71) Applicant: KYOCERA Corporation, Kyoto (JP)

(72) Inventors: Takehiko Suyama, Yamato (JP); Takahiro Kobayashi, Sagamihara (JP)

(73) Assignee: KYOCERA Corporation, Kyoto (JP)

( * ) Notice: Subject to any disclaimer, the term of this patent is extended or adjusted under 35 U.S.C. 154(b) by 128 days.

(21) Appl. No.: 17/357,606

(22) Filed: Jun. 24, 2021

(65) Prior Publication Data

US 2021/0320670 A1  Oct. 14, 2021

Related U.S. Application Data

(63) Continuation of application No. PCT/JP2019/049182, filed on Dec. 16, 2019.

(30) Foreign Application Priority Data

Dec. 25, 2018 (JP) ................................ 2018-241036
Dec. 25, 2018 (JP) ................................ 2018-241049

(51) Int. Cl.
*H03M 1/12*  (2006.01)
*G06F 3/05*  (2006.01)
*H03M 1/50*  (2006.01)

(52) U.S. Cl.
CPC ............ *H03M 1/1245* (2013.01); *G06F 3/05* (2013.01); *H03M 1/50* (2013.01)

(58) Field of Classification Search
CPC .............................. H03M 1/1245; H03M 1/50
USPC ................................................... 341/155, 122
See application file for complete search history.

(56) References Cited

U.S. PATENT DOCUMENTS

| 8,325,865 | B1* | 12/2012 | Rofougaran | ........... H04B 1/001 375/350 |
| 2006/0098769 | A1* | 5/2006 | Na | ........... G09G 5/008 375/355 |
| 2007/0081578 | A1* | 4/2007 | Fudge | .................. H04B 1/0003 375/130 |
| 2016/0033309 | A1* | 2/2016 | Peeters Weem | ....... G01D 18/00 702/89 |

FOREIGN PATENT DOCUMENTS

| JP | S62-051317 A | 3/1987 |
| JP | S63-171013 A | 7/1988 |
| JP | H03-238923 A | 10/1991 |
| JP | H08-051363 A | 2/1996 |
| JP | H11-163725 A | 6/1999 |
| JP | 2003-318759 A | 11/2003 |

(Continued)

*Primary Examiner* — Peguy Jean Pierre
(74) *Attorney, Agent, or Firm* — Studebaker & Brackett PC

(57) ABSTRACT

An analog-to-digital converter (1) includes an S/H circuit (10) that samples and holds an analog input signal in synchronization with a first sampling clock signal (CLK1), a filter circuit (20) that smooths an output signal of the S/H circuit (10), and an ADC circuit (30) that samples an output signal of the filter circuit (20) in synchronization with a second sampling clock signal (CLK2) different from the first sampling clock signal (CLK1), and outputs a digital signal corresponding to an amplitude of the output signal that is sampled.

6 Claims, 5 Drawing Sheets

(56) References Cited

FOREIGN PATENT DOCUMENTS

| JP | 2004-013244 A | 1/2004 |
| JP | 2008-072406 A | 3/2008 |
| JP | 2009-159432 A | 7/2009 |

* cited by examiner

US 11,784,655 B2

ANALOG-TO-DIGITAL CONVERTER, WIRELESS COMMUNICATION APPARATUS, AND ANALOG-TO-DIGITAL CONVERSION METHOD

RELATED APPLICATIONS

The present application is a continuation based on PCT Application No. PCT/JP2019/049182, filed on Dec. 16, 2019, which claims the benefit of Japanese Patent Application No. 2018-241036 filed on Dec. 25, 2018, and Japanese Patent Application No. 2018-241049 filed on Dec. 25, 2018. The content of which is incorporated by reference herein in their entirety.

TECHNICAL FIELD

The present disclosure relates to an analog-to-digital converter, a wireless communication apparatus, and an analog-to-digital conversion method.

BACKGROUND ART

Known analog-to-digital converters in the related arts include a sample-and-hold circuit for sampling and holding an analog input signal at discrete times based on a sampling rate, and an analog-to-digital converter circuit that quantifies the amplitude of the sampled signal to convert the signal into a digital signal.

Typically, by limiting the highest frequency of the analog input signal to up to ½ of the sampling rate, the original analog input signal can be reconstructed from the sampling result with no error (Nyquist sampling theorem).

In recent years, a technology called undersampling has gathered interest as a technique of sampling at a sampling rate that is less than two times the highest frequency of an analog input signal in a radio frequency (RF) band in order to perform analog-to-digital conversion on the analog input signal and perform down-converting (i.e., converting to a frequency band lower than the RF band) in wireless communication apparatuses (see, for example, Patent Document 1).

In an analog-to-digital converter that performs undersampling, a sampling rate (Fs) of two times or more the bandwidth (BW) of the analog input signal must be set and the analog input signal must be within an N-th Nyquist zone, and analog-to-digital conversion is performed on an image on the first Nyquist zone sampled under these conditions.

CITATION LIST

Patent Document

Patent Document 1: Japanese application publication No. 2008-72406 A

SUMMARY

An analog-to-digital converter according to a first aspect includes a sample-and-hold circuit configured to sample and hold an analog input signal in synchronization with a first sampling clock signal, a filter circuit configured to smooth an output signal of the sample-and-hold circuit, and an analog-to-digital converter circuit configured to sample an output signal of the filter circuit in synchronization with a second sampling clock signal different from the first sampling clock signal, and output a digital signal corresponding to an amplitude of the output signal that is sampled.

An analog-to-digital converter according to a second aspect includes a distribution circuit configured to distribute N analog input signals, N being equal to or more than two, N sample-and-hold circuits configured to sample and hold the N analog input signals in synchronization with N first sampling clock signals having the same frequency and different phases, a merge circuit configured to merge output signals of the N sample-and-hold circuits, and an analog-to-digital converter circuit configured to sample an output signal of the merge circuit in synchronization with a second sampling clock signal different from the N first sampling clock signals, and output a digital signal corresponding to an amplitude of the output signal that is sampled.

A wireless communication apparatus according to a third aspect includes the analog-to-digital converter according to the first or second aspect.

An analog-to-digital conversion method according to a fourth aspect includes sampling and holding an analog input signal in synchronization with a first sampling clock signal, smoothing an analog signal that is sampled and held, and sampling the analog signal that is smoothed in synchronization with a second sampling clock signal different from the first sampling clock signal, and outputting a digital signal corresponding to an amplitude of the analog signal that is sampled.

An analog-to-digital conversion method according to a fifth aspect includes distributing N analog input signals, N being equal to or more than two, sampling and holding the N analog input signals in synchronization with N first sampling clock signals having the same frequency and different phases, merging output signals of the N analog signals that are sampled and held, and sampling the output signal that is merged in synchronization with a second sampling clock signal different from the first sampling clock signal, and outputting a digital signal corresponding to an amplitude of the output signal that is sampled.

DESCRIPTION OF EMBODIMENTS

Current wireless communication methods must be compatible with various bands (carrier frequencies) and wide bandwidths (e.g., 100 MHz or higher). Therefore, in order to perform undersampling, the sampling rate needs to be changed in accordance with changes in the frequency and bandwidth of the analog input signal.

In a known analog-to-digital converter, a sample-and-hold circuit and an analog-to-digital converter circuit synchronize with a common sampling clock signal so that the analog-to-digital converter circuit samples the signal in a period where the sample-and-hold circuit holds the signal.

Thus, changing the frequency (sampling rate) of the sampling clock signal based on a change in the frequency or bandwidth of the analog input signal also changes the sampling rate of the digital signal output by the analog-to-digital converter.

However, a digital circuit (e.g., a DSP) in a stage subsequent to the analog-to-digital converter requires a fixed sampling rate. Thus, processing (so-called sampling rate conversion) is required to convert the sampling rate of the digital signal output by the analog-to-digital converter to meet the requirements of the digital circuit at the subsequent stage, thereby complicating processing.

Thus, with the present disclosure, it is possible to output a digital signal having an appropriate sampling rate even when undersampling is performed.

Embodiments will be described with reference to the drawings. In the description of the drawings, identical or similar components are denoted by the same or similar reference symbols.

First Embodiment

Configuration Example of Analog-to-digital Converter

Figure 1:
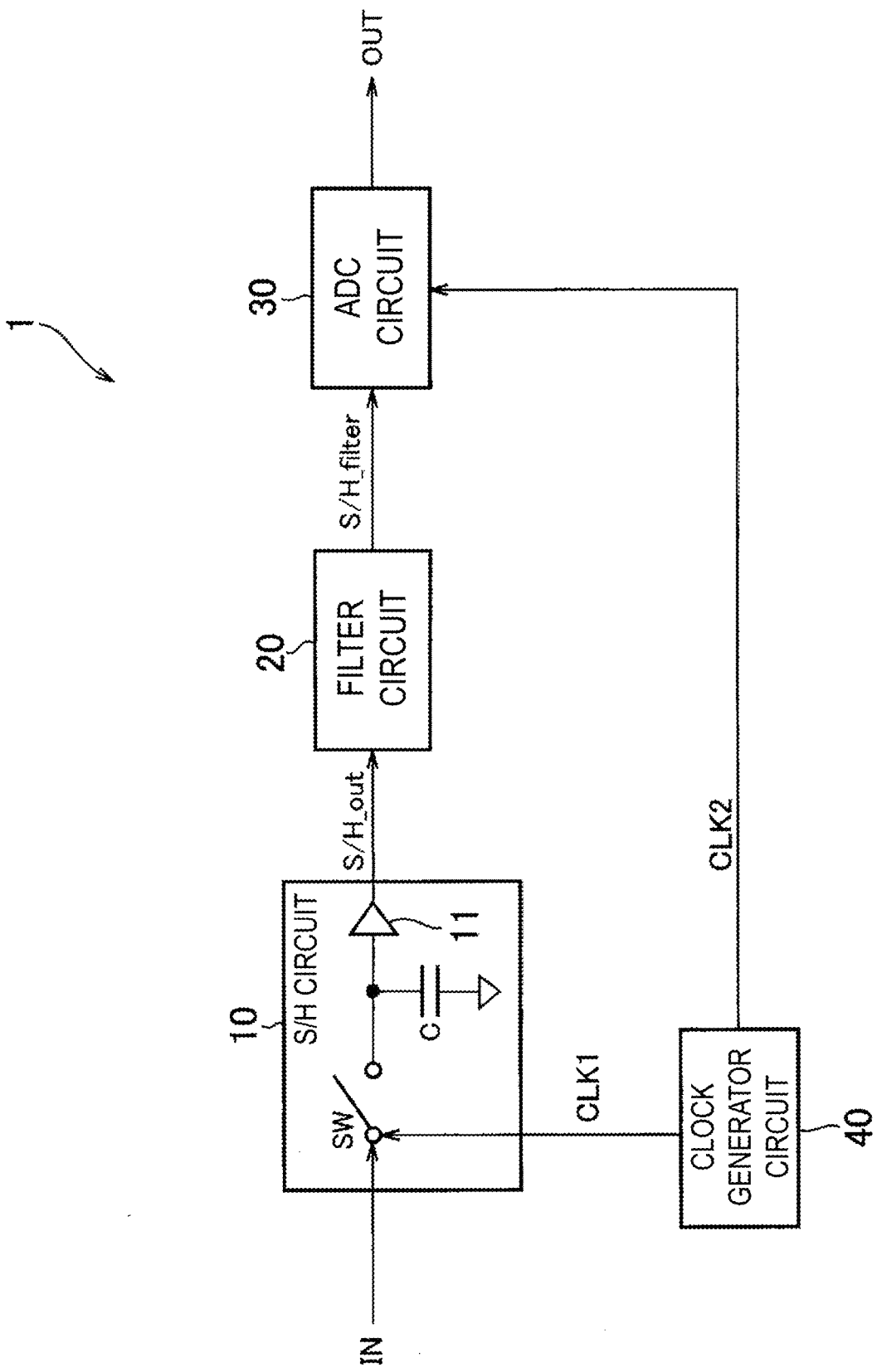
FIG. 1 is a block diagram illustrating a configuration of an analog-to-digital converter according to a first embodiment.

FIG. 1 is a block diagram illustrating a configuration of an analog-to-digital converter 1 according to a first embodiment. The analog-to-digital converter 1 performs undersampling to convert an RF-band analog input signal IN to a digital signal and perform down-converting (i.e., conversion to a frequency band lower than the RF band). In undersampling, sampling is performed at a sampling rate (Fs) that is less than a Nyquist frequency being two times the highest frequency of the analog input signal IN.

As illustrated in FIG. 1, the analog-to-digital converter 1 includes a sample-and-hold (S/H) circuit 10, a filter circuit 20, an analog-to-digital converter (ADC) circuit 30, and a clock generator circuit 40.

The analog input signal IN and a first sampling clock signal CLK1 are input to the S/H circuit 10. The S/H circuit 10 samples and holds the analog input signal IN in synchronization with the first sampling clock signal CLK1 and outputs a sampled and held signal S/H_out to the filter circuit 20.

The S/H circuit 10 includes, for example, a switch SW, a capacitor C provided on the output side of the switch SW, and a buffer amplifier 11 provided in an output stage of the S/H circuit 10. When the first sampling clock signal CLK1 is at a high level (H level), the switch SW is in a conductive state (ON state) and outputs the analog input signal IN to a subsequent stage via the buffer amplifier 11. On the other hand, when the first sampling clock signal CLK1 is at a low level (L level), the switch SW is in a non-conducting state (OFF state). When the first sampling clock signal CLK1 is at the L level, the capacitor C holds a voltage that is proportional to the average value of a voltage when the switch SW is in the ON state. The voltage held by the capacitor C is output via the buffer amplifier 11. That is, the period in which the first sampling clock signal CLK1 is at the L level corresponds to a holding period in which the S/H circuit 10 holds the signal.

The filter circuit 20 smooths the signal S/H_out input from the S/H circuit 10 and outputs a smoothed signal S/H_filter to the ADC circuit 30. The filter circuit 20 includes, for example, a low-pass filter (LPF) configured to remove high-frequency components in the output signal S/H_out of the S/H circuit 10. However, the filter circuit 20 need only include a filter capable of removing high-frequency components, and may include a band-pass filter (BPF) instead of the LPF.

The output signal S/H_filter of the filter circuit 20 and a second sampling clock signal CLK2 are input to the ADC circuit 30. The second sampling clock signal CLK2 is a sampling clock signal that is different from the first sampling clock signal CLK1. The ADC circuit 30 samples the output signal S/H_filter of the filter circuit 20 in synchronization with the second sampling clock signal CLK2, and outputs a digital signal OUT corresponding to the amplitude of the sampled output signal. The ADC circuit 30 outputs the digital signal OUT having N (N≥1) bits to a digital circuit 4 (not illustrated in FIG. 1, see FIG. 5) in a subsequent stage.

The clock generator circuit 40 generates the first sampling clock signal CLK1 and the second sampling clock signal CLK2. The clock generator circuit 40 outputs the first sampling clock signal CLK1 to the S/H circuit 10 and outputs the second sampling clock signal CLK2 to the ADC circuit 30. The first sampling clock signal CLK1 and the second sampling clock signal CLK2 may be asynchronous with each other. Alternatively, the first sampling clock signal CLK1 and the second sampling clock signal CLK2 may have different frequencies.

The frequency of the first sampling clock signal CLK1 is less than the Nyquist frequency, which is two times the highest frequency of the analog input signal IN.

Specifically, the clock generator circuit 40 variably sets the frequency of the first sampling clock signal CLK1 in accordance with a change in the frequency and/or bandwidth of the analog input signal IN for undersampling. For example, when the frequency of the first sampling clock signal CLK1 is "Fs" and the bandwidth of the analog input signal IN is "BW", the clock generator circuit 40 sets the frequency (Fs) of the first sampling clock signal CLK1 to satisfy the following relationship:

$$Fs > 2BW \ldots \quad (1).$$

The clock generator circuit 40 also sets the frequency (Fs) of the first sampling clock signal CLK1 so that the analog input signal IN is within an N-th Nyquist zone. For example, when the Nyquist zone is "NZ" (NZ=1, 2, 3, 4 . . . ), and the center of the 2nd Nyquist zone is Fc, the clock generator circuit 40 sets the frequency (Fs) of the first sampling clock signal CLK1 to satisfy the following equation:

$$Fs = 4Fc/(2NZ-1) \ldots \quad (2).$$

However, if the signal can be removed in the 1st Nyquist zone without problems, the frequency (Fc) of the analog input signal IN may be offset from the center of the Nyquist zone.

On the other hand, the clock generator circuit 40 sets the frequency of the second sampling clock signal CLK2 according to a sampling rate requirement required of the digital input signal by the digital circuit 4 in a subsequent stage of the ADC circuit 30 (a stage after the analog-to-digital converter 1). The frequency of the second sampling clock signal CLK2 may be constant regardless of changes in the frequency and/or bandwidth of the analog input signal.

For example, if there is a digital signal processor (DSP) in a subsequent stage of the ADC circuit 30 and the DSP requests "Fs_req" as the sampling rate of input, the clock generator circuit 40 may set the frequency of the second sampling clock signal CLK2 as Fs_req. Alternatively, if a circuit that performs downsampling (decimation) by a factor of four is present between the ADC circuit 30 and the DSP, the clock generator circuit 40 may set a frequency that is four times the Fs_req as the frequency of the second sampling clock signal CLK2. In other words, if a circuit that performs downsampling (decimation) by a factor of M is present between the ADC circuit 30 and the DSP, the clock generator circuit 40 may set a frequency that is M times the Fs_req as the frequency of the second sampling clock signal CLK2.

As described above, with the analog-to-digital converter 1 according to the first embodiment, because the filter circuit 20 smooths the output signal S/H_out of the S/H circuit 10, the ADC circuit 30 can perform sampling at any timing. That is, unlike in the related art, the ADC circuit 30 can perform sampling at a timing other than the period in which the S/H circuit 10 holds the signal.

In the analog-to-digital converter 1 that performs undersampling, the clock generator circuit 40 needs to be compatible with various bands (carrier frequencies) and wide bandwidths (e.g., 100 MHz or higher). In this case, with the analog-to-digital converter 1 according to the first embodiment, the frequency of the second sampling clock signal CLK2 can be maintained at a constant frequency even when the frequency of the first sampling clock signal CLK1 is changed.

Accordingly, with the analog-to-digital converter 1 according to the first embodiment, the digital signal OUT having a constant sampling rate can be output even when the frequency of the first sampling clock signal CLK1 is changed. Thus, performing complex sampling rate conversion is unnecessary. As a result, processing in the analog/digital converter 1 that performs undersampling can be prevented from becoming more complicated.

Operation Example of Analog-to-Digital Converter

Figure 2:
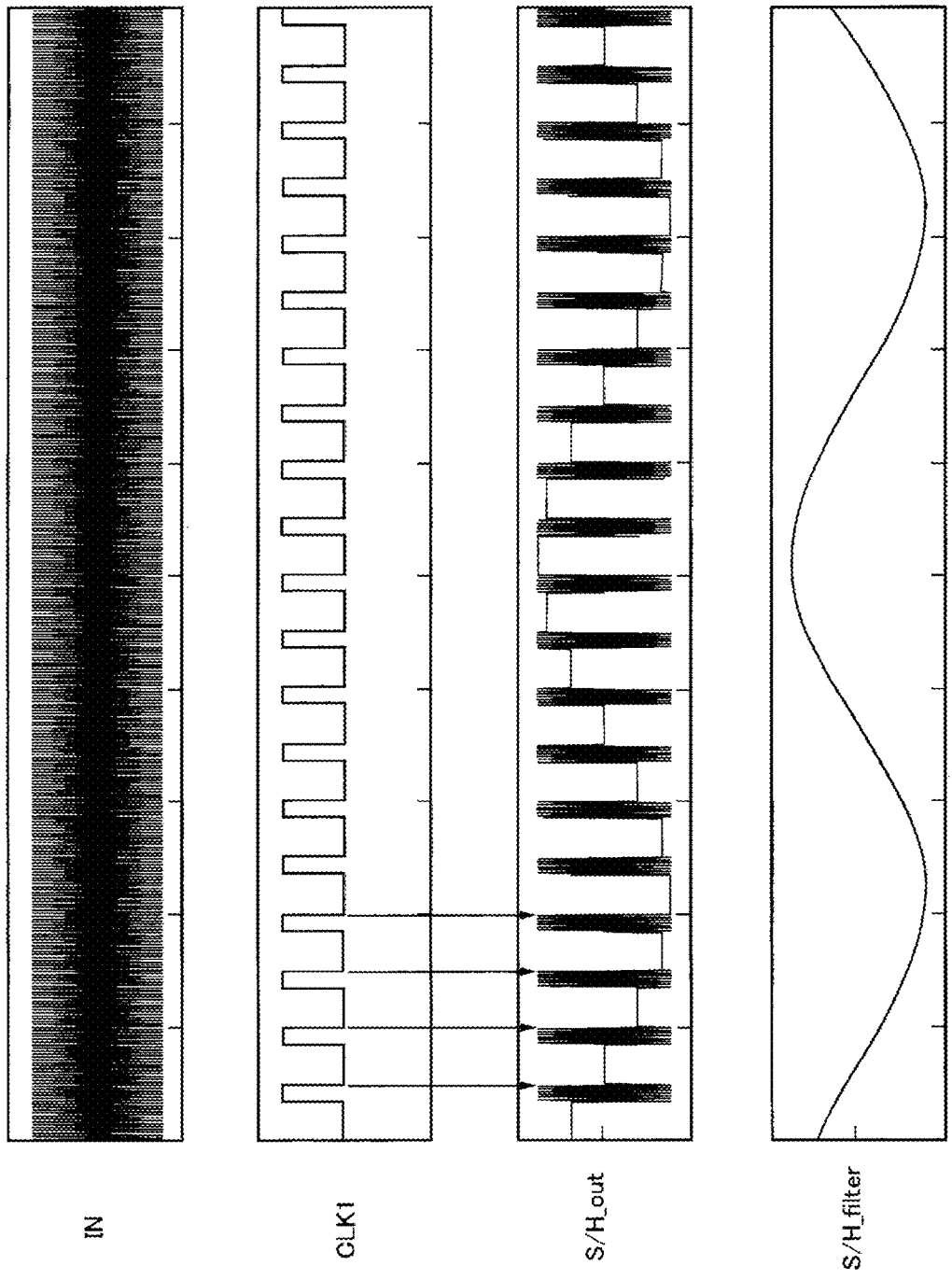
FIG. 2 is a time chart illustrating operational waveforms of the analog-to-digital converter according to the first embodiment.

FIG. 2 is a time chart illustrating operational waveforms of the analog-to-digital converter 1 according to the first embodiment. Note that in FIG. 2, the horizontal axis represents time and the vertical axis represents amplitude.

As illustrated in FIG. 2, the S/H circuit 10 samples and holds the analog input signal IN in synchronization with the first sampling clock signal CLK1 and outputs the sampled and held analog signal S/H_out.

Here, the period in which the first sampling clock signal CLK1 is at the H level corresponds to a sampling period. On the other hand, the period in which the first sampling clock signal CLK1 is at the L level corresponds to a holding period in which the S/H circuit 10 holds the signal.

Note that in a conventional analog-to-digital converter, since the filter circuit 20 is not present, the ADC circuit 30 must sample the analog signal S/H_out within the holding period of the S/H circuit 10. Thus, the S/H circuit 10 and the ADC circuit 30 need to synchronize with a common sampling clock signal.

On the other hand, the analog-to-digital converter 1 according to the first embodiment is configured such that the filter circuit 20 smooths the analog signal S/H_out and the ADC circuit 30 samples the smoothed analog signal. Thus, the ADC circuit 30 can perform sampling at a timing other than the holding period of the S/H circuit 10.

Thus, the ADC circuit 30 can operate in synchronization with the second sampling clock signal CLK2 that is different from the first sampling clock signal CLK1, and the second sampling clock signal CLK2 can be set to any frequency.

Accordingly, the analog-to-digital converter 1 can output a digital signal OUT having a desired sampling rate.

Second Embodiment

Differences between the first embodiment and a second embodiment will mainly be described. Hereinafter, the configuration of an analog-to-digital converter 1 according to the second embodiment will be described.

Configuration Example of Analog-to-Digital Converter

Figure 3:
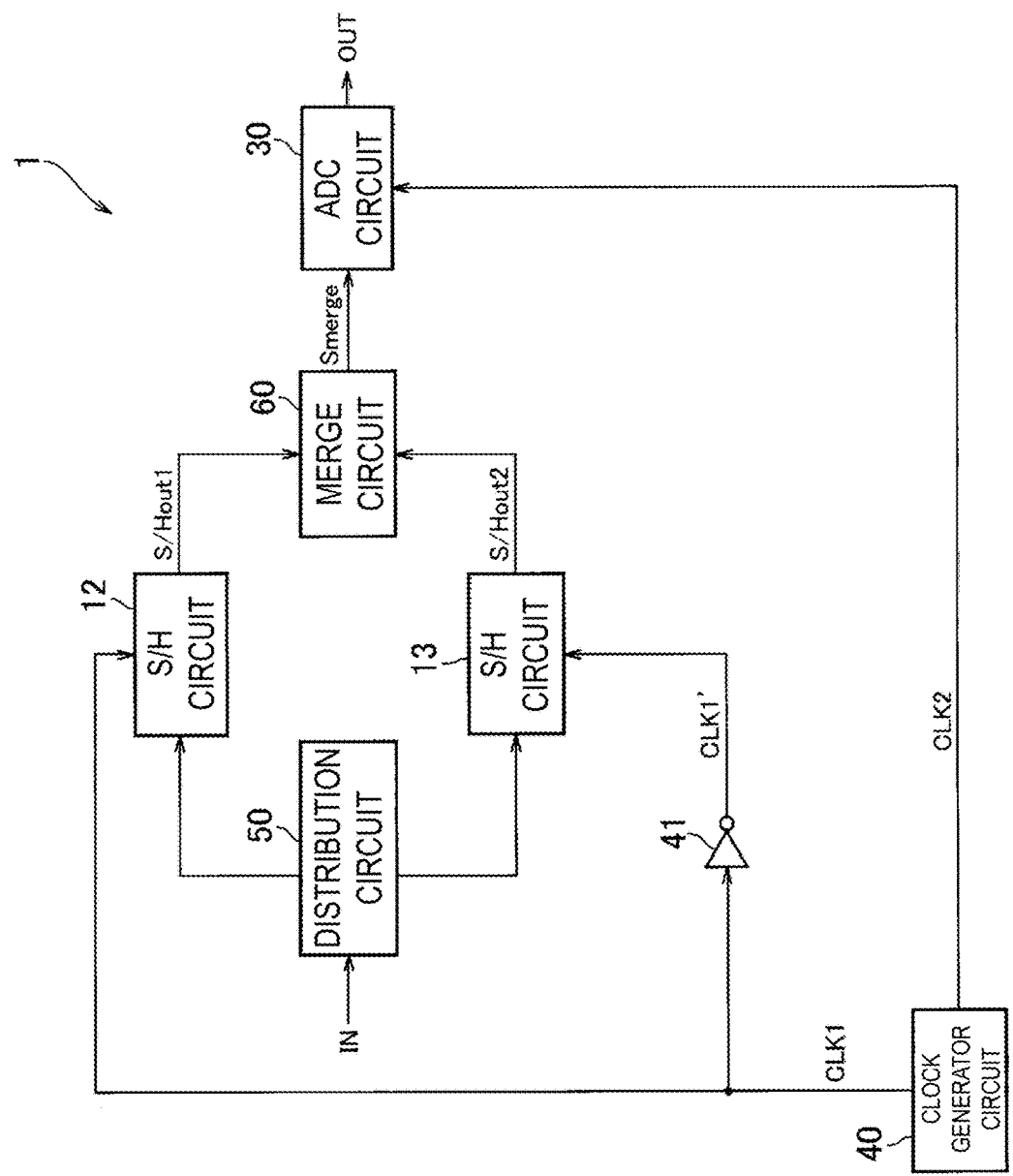
FIG. 3 is a block diagram illustrating a configuration of an analog-to-digital converter according to a second embodiment.

FIG. 3 is a block diagram illustrating the configuration of the analog-to-digital converter 1 according to the second embodiment. The analog-to-digital converter 1 performs undersampling in the same manner as in the first embodiment.

As illustrated in FIG. 3, the analog-to-digital converter 1 includes a distribution circuit 50, two sample-and-hold (S/H) circuits 12 and 13, a merge circuit 60, an analog-to-digital converter (ADC) circuit 30, a clock generator circuit 40, and an inverter circuit 41.

The distribution circuit 50 distributes two analog input signals IN, outputs one analog input signal IN to the S/H circuit 12, and outputs the other analog input signal IN to the S/H circuit 13.

The analog input signal IN and the first sampling clock signal CLK1 are input to the S/H circuit 12. The S/H circuit 12 samples and holds the analog input signal IN in synchronization with the first sampling clock signal CLK1, and outputs a sampled and held signal S/Hout1 to the merge circuit 60. The S/H circuit 12 samples and holds the analog input signal IN when the first sampling clock signal CLK1 is at a high level (H level).

The analog input signal IN and a first sampling clock signal CLK1' are input to the S/H circuit 13. The first sampling clock signal CLK1' is generated by inversing the phase of the first sampling clock signal CLK1. Thus, the first sampling clock signals CLK1 and CLK1' are opposite in phase to each other. The S/H circuit 13 samples and holds the analog input signal IN in synchronization with the first sampling clock signal CLK1' and outputs a sampled and held signal S/Hout2 to the merge circuit 60. The S/H circuit 12 samples and holds the analog input signal IN when the first sampling clock signal CLK1' is at the H level.

Thus, the S/H circuits 12 and 13 sample and hold the analog input signals IN at complementary timings. Specifically, the S/H circuit 13 does not output the output signal S/Hout2 while the S/H circuit 12 outputs the output signal S/Hout1, and the S/H circuit 12 does not output the output signal S/Hout1 while the S/H circuit 13 outputs the output signal S/Hout2.

The merge circuit 60 merges the signal S/Hout1 input from the S/H circuit 12 and the signal S/Hout2 input from the S/H circuit 13, and outputs a merged signal Smerge to the ADC circuit 30. The S/H circuits 12 and 13 output the signals S/Hout1 and S/Hout2 at complementary timings. Thus, when the merge circuit 60 merges the signals S/Hout1 and S/Hout2, a stepwise continuous waveform is acquired as the signal Smerge.

The output signal Smerge of the merge circuit 60 and a second sampling clock signal CLK2 are input to the ADC circuit 30. The second sampling clock signal CLK2 is a sampling clock signal that is different from the first sampling clock signal CLK1. The ADC circuit 30 samples the output signal Smerge of the merge circuit 60 in synchronization with the second sampling clock signal CLK2, and further outputs a digital signal OUT corresponding to the amplitude of each sampled signal. The ADC circuit 30 outputs the digital signal OUT having L (L≥1) bits to the digital circuit 4 in a subsequent stage.

The clock generator circuit 40 generates the first sampling clock signal CLK1 and the second sampling clock signal CLK2. The clock generator circuit 40 outputs the first sampling clock signal CLK1 to the S/H circuit 12 and the inverter circuit 41 and outputs the second sampling clock signal CLK2 to the ADC circuit 30. The first sampling clock signal CLK1 and the second sampling clock signal CLK2 may be asynchronous with each other. Alternatively, the first sampling clock signal CLK1 and the second sampling clock signal CLK2 may have different frequencies.

The inverter circuit 41 inverts the phase of the first sampling clock signal CLK1 input from the clock generator circuit 40 and outputs the first sampling clock signal CLK1' to the S/H circuit 13. The inverter circuit 41 may perform phase inversion by shifting the phase of the first sampling clock signal CLK1 by 180°.

The frequency of the first sampling clock signal CLK1 generated by the clock generator circuit 40 is less than the Nyquist frequency, which is two times the highest frequency of the analog input signal IN. Note that the specific methods of setting the frequencies of the first and second sampling clock signals CLK1 and CLK2 are the same as those in the first embodiment.

As described above, with the analog-to-digital converter 1 according to the second embodiment, the merge circuit 60 outputs a stepwise continuous waveform as the signal Smerge, and thus the ADC circuit 30 can perform sampling at any timing.

In the analog-to-digital converter 1 that performs undersampling, the clock generator circuit 40 needs to be compatible with various bands (carrier frequencies) and wide bandwidths (e.g., 100 MHz or higher). In this case, with the analog-to-digital converter 1 according to the second embodiment, the frequency of the second sampling clock signal CLK2 can be maintained at a constant frequency even when the frequency of the first sampling clock signal CLK1 is changed.

Accordingly, the analog-to-digital converter 1 according to the second embodiment can output a digital signal OUT having a constant sampling rate even when the frequency of the first sampling clock signal CLK1 is changed. Thus, performing complex sampling rate conversion is unnecessary. As a result, processing in the analog/digital converter 1 that performs undersampling can be prevented from becoming more complicated.

Operation Example of Analog-to-Digital Converter

Figure 4:
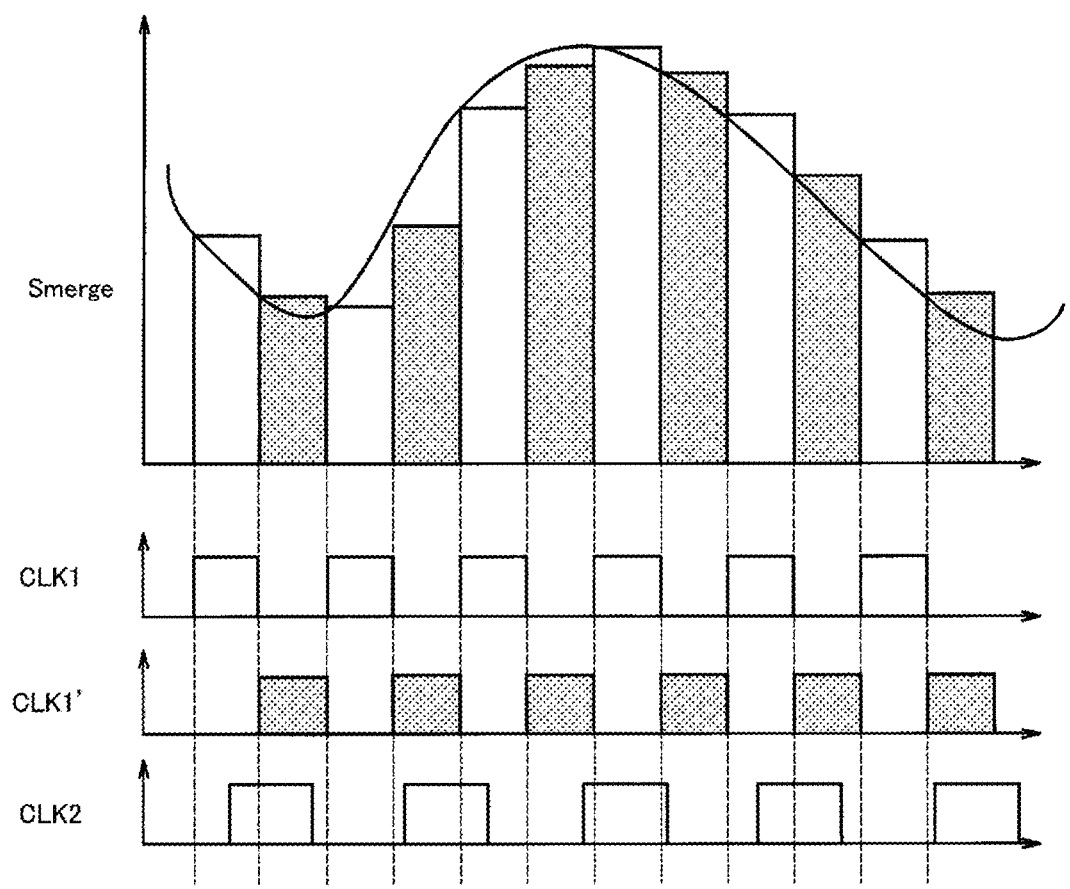
FIG. 4 is a time chart illustrating operational waveforms of the analog-to-digital converter according to the second embodiment.

FIG. 4 is a time chart illustrating operational waveforms of the analog-to-digital converter 1 according to the second embodiment. Note that in FIG. 4, the horizontal axis represents time and the vertical axis represents amplitude (voltage).

As illustrated in FIG. 4, the S/H circuit 12 samples and holds the analog input signal IN when the first sampling clock signal CLK1 is at the H level and outputs the sampled and held signal S/Hout1.

In addition, the S/H circuit 13 samples and holds the analog input signal IN when the first sampling clock signal CLK1' is at the H level and outputs the sampled and held signal S/Hout2.

When the merge circuit 60 merges the signals S/Hout1 and S/Hout2, a stepwise continuous waveform is acquired as the signal Smerge. The ADC circuit 30 samples the signal Smerge at a timing when the second sampling clock signal CLK2 rises from the L level to the H level.

Thus, the ADC circuit 30 can perform a sampling operation in synchronization with the second sampling clock signal CLK2 that is different from the first sampling clock signal CLK1, and the second sampling clock signal CLK2 can be set to any frequency. Accordingly, the analog-to-digital converter 1 can output a digital signal OUT having a desired sampling rate.

Configuration Example of Wireless Communication Apparatus

Figure 5:
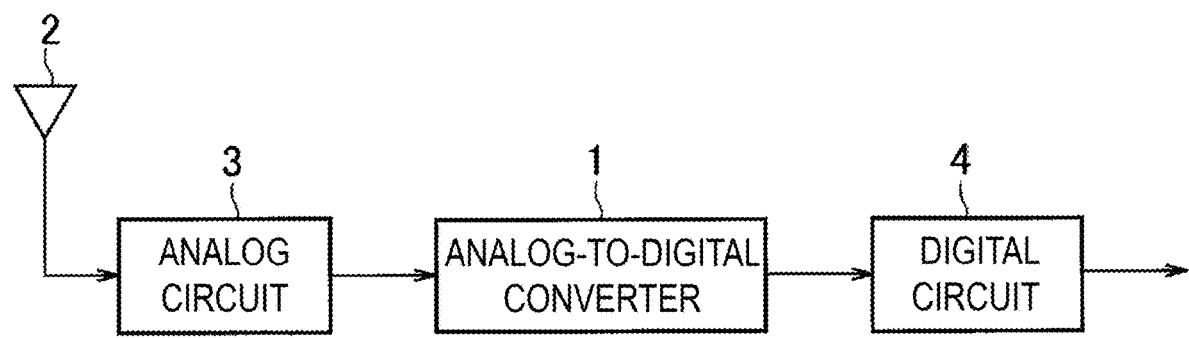
FIG. 5 is a block diagram illustrating a configuration example of a receiver of a wireless communication apparatus including the analog-to-digital converter according to the first or second embodiment.

FIG. 5 is a block diagram illustrating a configuration example of a receiver of a wireless communication apparatus including the analog-to-digital converter 1 according to the first or second embodiment described above.

As illustrated in FIG. 5, in addition to the analog-to-digital converter 1 according to the embodiments described above, the wireless communication apparatus includes an antenna 2, an analog circuit 3, and a digital circuit 4.

The antenna 2 receives a wireless signal and outputs the received wireless signal to the analog circuit 3.

The analog circuit 3 includes a low-noise amplifier (LNA) and an analog filter circuit. The analog circuit 3 outputs an RF band analog signal to the analog-to-digital converter 1.

The analog-to-digital converter 1 performs analog-to-digital conversion on the RF band analog signal input from the analog circuit 3, performs down-converting (i.e., conversion to a frequency band that is lower than the RF band), and outputs a digital signal to the digital circuit 4. The analog-to-digital converter 1 may perform down-converting to an intermediate frequency (IF) band or down-converting to a baseband (BB) band.

The digital circuit 4 includes a DSP that performs digital signal processing such as digital filtering, and performs digital signal processing on the digital signal input from the analog-to-digital converter 1 and outputs the processed digital signal.

Other Embodiments

The second embodiment described above deals with an exemplary case where the two S/H circuits 12 and 13 are provided, but N (N≥2) S/H circuits may be provided. For example, three or more S/H circuits may be provided. In this case, the distribution circuit 50 distributes analog input signals IN to three or more S/H circuits, and the merge circuit 60 merges the output signals of the three or more S/H circuits.

For example, when there are three S/H circuits, a phase shift circuit is provided in place of the inverter circuit 41 to shift the phase of each first sampling clock signal CLK1 by 120°. The phase shift circuit outputs three first sampling clock signals CLK1 each having a phase shifted by 120° to the three S/H circuits. Further, the clock generator circuit 40 sets the length of time of the H level of the first sampling clock signal CLK1 to be a time obtained by dividing one period of the first sampling clock signal CLK1 by three. As a result, when the three S/H circuits output signals to the merge circuit 60 at different timings and the merge circuit 60 merges the output signals of the three S/H circuits, a stepwise continuous waveform is acquired as the signal Smerge.

Note that the analog-to-digital converter 1 according to the first or second embodiment described above may be configured as a semiconductor integrated circuit by being integrated on a semiconductor substrate.

Embodiments have been described above in detail with reference to the drawings, but specific configurations are not limited to those described above, and various design modifications can be made without departing from the gist of the present disclosure.

The invention claimed is:

1. An analog-to-digital converter comprising:
a sample-and-hold circuit configured to sample and hold an analog input signal in synchronization with a first sampling clock signal;
a filter circuit configured to smooth an output signal of the sample-and-hold circuit; and
an analog-to-digital converter circuit configured to sample an output signal of the filter circuit in synchronization with a second sampling clock signal different from the first sampling clock signal, and output a digital signal corresponding to an amplitude of the output signal that is sampled, wherein
a frequency of the first sampling clock signal is less than a Nyquist frequency being two times the highest frequency of the analog input signal, and
the analog-to-digital converter is configured to perform analog-to-digital conversion on the analog input signal in a radio frequency band and convert the analog input signal to a signal in a frequency band lower than the radio frequency band.

2. The analog-to-digital converter according to claim 1, wherein the filter circuit comprises a low-pass filter or a band-pass filter configured to remove high-frequency components included in the output signal of the sample-and-hold circuit.

3. The analog-to-digital converter according to claim 1, wherein
a frequency of the second sampling clock signal is set irrespective of the first sampling clock signal and according to a sampling rate requirement required of a digital input signal by a digital circuit in a subsequent stage of the analog-to-digital converter circuit.

4. A wireless communication apparatus comprising the analog-to-digital converter according to claim 1.

5. An analog-to-digital converter comprising:
a distribution circuit configured to distribute N analog input signals, N being equal to or more than two;
N sample-and-hold circuits configured to sample and hold the N analog input signals in synchronization with N first sampling clock signals having the same frequency and different phases;
a merge circuit configured to merge output signals of the N sample-and-hold circuits; and an analog-to-digital converter circuit configured to sample an output signal of the merge circuit in synchronization with a second sampling clock signal different from the N first sampling clock signals, and output a digital signal corresponding to an amplitude of the output signal that is sampled, wherein
a frequency of the first sampling clock signal is less than a Nyquist frequency being two times the highest frequency of the analog input signal, and
the analog-to-digital converter is configured to perform analog-to-digital conversion on the analog input signal in a radio frequency band and convert the analog input signal to a signal in a frequency band lower than the radio frequency band.

6. The analog-to-digital converter according to claim 5, wherein
N has a value of two, and
the two first sampling clock signals are opposite in phase to each other.

* * * * *